United States Patent
Lu et al.

[11] Patent Number: 5,818,371
[45] Date of Patent: Oct. 6, 1998

[54] COHERENT SYNCHRONIZATION AND PROCESSING OF PULSE GROUPS

[75] Inventors: Chyi Haw Lu; Jerry D. Holmes, both of Plano, Tex.; Hugh L. Scott, Breckenridge, Colo.

[73] Assignee: Raytheon TI Systems Inc., Lewisville, Tex.

[21] Appl. No.: 764,828

[22] Filed: Dec. 12, 1996

[51] Int. Cl.$^6$ .................................................. G01S 13/00
[52] U.S. Cl. ........................................... 341/122; 342/192
[58] Field of Search ................................... 341/122, 157; 342/192

[56] References Cited

U.S. PATENT DOCUMENTS

| | | | |
|---|---|---|---|
| 4,620,192 | 10/1986 | Collins | 342/128 |
| 4,791,404 | 12/1988 | Hollister | 341/122 |
| 5,539,412 | 7/1996 | Mendelson | 342/192 |
| 5,563,601 | 10/1996 | Cataldo | 342/25 |
| 5,646,623 | 7/1997 | Walters et al. | 342/129 |

*Primary Examiner*—Marc S. Hoff
*Attorney, Agent, or Firm*—Baker & Botts, L.L.P.

[57] ABSTRACT

A method and system for synchronization of pulse groups without a synchronization signal which comprises selecting a plurality of equal time length coherent processing intervals from a stream of data in the time domain, generally analog data. The data in each of the coherent processing intervals is sampled during each of N equal pulse repetition intervals to provide samples of data, each sampling taking place for an equal portion of the pulse repetition interval. Each of the samples of data is identified according to the position thereof in the associated coherent processing interval. The time domain data is converted to frequency domain data on the basis of the position of the time domain data in the coherent processing interval, all of the samples with the same position in a different coherent processing interval being separately collectively converted. The frequency domain data is then compensated for phase rotation by determining the length of the coherent processing interval, the length of the pulse repetition interval and the duration of the sampling and altering the phase of the frequency domain data in response thereto. An FFT is provided of selected ones of the frequency domain data. The results of the FFT of the selected ones of the frequency domain data are then displayed.

28 Claims, 4 Drawing Sheets

COHERENT SYNCHRONIZATION AND PROCESSING OF PULSE GROUPS

BACKGROUND OF THE INVENTION

1. Field of the Invention

This invention relates to a method and system for synchronizing received pulse groups from a transmitter without the requirement of a distinct synchronizing signal.

2. Brief Description of the Prior Art

For applications where the transmitter and receiver cannot be conveniently co-located and whose operation must be synchronized, conventional approaches have required transmission of a synchronizing waveform from the transmitter to the receiver for the specific purpose of synchronization. Such synchronization is provided, for example, for synchronization of the analog to digital converter (ADC) sampling clock of the receiver to the pulse waveform source clock while the ADC produces received waveform samples which are used to implement some form of matched filter to the transmitted pulse sequence waveform. This requirement places an extra burden on both the transmitter site and the receiver site to support this extra communication link.

For example, in the case of most standard radars, the transmitter and receiver are co-located and therefore the requirement of synchronization does not present a problem. In the case of a remote receiver, such as, for example, bistatic radars or a semi-active guided missile, the problem of synchronization is present and is solved by the use of a synchronizing waveform which is received by an antenna and associated receiving equipment.

In many types of systems, such as, for example, radar, sonar, sonography, pulse modulation based communication systems and the like, communication is provided by means of waveforms which consist of a train of pulses as shown in FIG. 1. As can be seen from FIG. 1, the pulse waveform switches from the off-level to the on-level N times in the time period of interest denoted as the coherent processing interval (CPI). There is a time period from commencement of a pulse to the commencement of the next succeeding pulse denoted as the pulse repetition interval (PRI). The time period during which a pulse is at the on-level is denoted as the pulse width ($\tau$). The duty cycle (d) is the fractional on-time of the PRI and is denoted as $d=\tau/PRI$.

Within each pulse there is some waveform which may be (1) a constant amplitude, constant phase sinusoid or, (2) a frequency modulated signal, or (3) a phase modulated signal, or (4) any arbitrary waveform that has both phase and amplitude defined as a function of time. However, the waveforms within each of the N pulses are identical except for possible additive noise and/or clutter. Though the entire, continuous time waveform of FIG. 1 is not obtainable, samples of the waveform are available which are sampled at a uniform spacing of T seconds between any two consecutive samples with a sampling frequency, $f_s$ being $1/T$ samples per second.

The sampling procedure, shown in FIG. 2, is provided with the pulses of a typical waveform with the first two pulses of an exemplary waveform shown as sampled in FIG. 2A. The noise corrupted continuous time waveform from the summer ($\Sigma$) is sampled once each T second(s) to provide CPI/T samples for processing by a digital signal processing (DSP) procedure. The goal is to implement a matched filter processor as closely as possible.

It is necessary to provide a range/doppler map which is a two-dimensional amplitude response of the ideal matched filter which has been matched to the waveform of FIG. 1, at least in the sampled data sense of matched filter. The two-dimensions are usually designated as range and doppler. Range refers to the relative time within the total PRI whereas doppler refers to received frequency relative to transmitted signal frequency. For the case of radar, if the echo returns at the same frequency as was transmitted, then the doppler response would peak at zero Hz. If the target causing the echo were moving relative to the receiver/processor, then its echo would peak at a doppler value which depends upon the relative velocity of motion and the signal wavelength. A problem is that it is difficult to construct a matched filter in a standard manner because the number of taps required would be large and difficult to implement. Furthermore, fast Fourier transform (FFT) processing could require FFT lengths that are prohibitive for practical realization.

When the sampler in the receiver cannot be directly synchronized with the waveform generator of the transmitter, the receiver will obtain a different set of values from the second pulse than it received from the first pulse. Similarly, samples from the third pulse will be obtained at different phase values within the pulse than those obtained from the first two pulse sample sets.

It is therefore apparent that a great deal of hardware, both at the transmitter and at the receiver, can be saved by eliminating the requirement of the synchronizing waveform or, alternatively, that more accurate data can be received when a synchronization pulse is not being utilized.

SUMMARY OF THE INVENTION

In accordance with the present invention, relatively more accurate than possible prior art self synchronization is provided at the receiver and the requirement of a synchronizing waveform transmitted from transmitter to receiver can be substantially eliminated. Since the transmitter source is not required to send a distinct synchronizing waveform to the receiver and the receiver does not require a distinct synchronizing signal directly from the transmitter, there is a potential saving of a transmitter power amplifier, a transmitter antenna, a receiver antenna and a receiver/processor channel. Also, the task of steering the two antennas toward one another is avoided.

Briefly, for applications where the transmitter and receiver cannot be conveniently co-located, a free-running ADC is provided. The receiver ADC clock need not be locked to the pulse waveform source clock. Properties of the FFT algorithm are combined with some knowledge of the transmitted waveform, specifically its pulsewidth (PW) and pulse repetition interval (PRI) which can be determined after receipt of a small number of pulses at the receiver and the already provided knowledge of the receiver ADC sampling interval in an innovative procedure. This procedure permits one to realize matched filter performance as if one had actively synchronized the receiver ADC sampling clock with the pulse waveform source clock.

The system includes an antenna at an RF receiver which receives the incoming analog signal, the receiver then amplifying and superheterodyne converting to base band (near DC frequency region) the received RF signal within the bandwidth limitations of the system analog to digital converter (ADC). The ADC samples the bandwidth limited RF waveform and converts the waveform to corresponding digital words. The digital words from the ADC are stored in a digital memory in range bins with each row corresponding to a succeeding PRI and each range bin in a row corresponding to a particular time interval in the PRI.

To define a range bin, each pulse width (Σ) is given a number determined by the location thereof in a PRI, the PRI generally being equal to many pulse widths (Σ) (i.e. "1" for the first pulse width in the PRI, "2" for the second pulse width in the PRI, . . . "N" for the Nth or last pulse width in the PRI. That number corresponds to and is the range bin for that pulse. It follows that the data from each pulse of the same number from each PRI in a CPI is placed in the same range bin. It should be understood that there will be at least two range bins in each PRI and generally the number of range bins per PRI will be a number much larger than two and typically about 100 in the case of, for example, a radar since a radar transmits about 1% of the time and is otherwise off.

The digital words are retrieved from the digital memory and fast Fourier transformed (FFT), preferably with a hardware FFT chip, for transformation to the frequency domain as complex numbers with a phase and stored in range bins based upon frequency (i.e., DC, 1st harmonic, 2nd harmonic, etc.), the stored data being a complex number having an amplitude and phase.

Using the known pulse repetition interval (PRI), pulse width (τ) and ADC sample interval (T), the proper phase rotation is computed to be applied to each complex number in the frequency domain data, providing compensated frequency domain data. The compensated frequency domain data is grouped by range bin, again according to frequency. More specifically, the data in each range bin individually (the system is designed to have some power of two ($n^2$) number of samples in each range bin, this being provided by adding the appropriate number of zeros, if necessary, to provide the proper number of samples) are then collectively subjected to the fast Fourier transform (FFT) to provide the $n^2$ complex numbers which are now contiguous in frequency rather than in time. The result is that the first term out is the DC term, the second term is the first harmonic, the third term is the second harmonic, etc. These terms are then stored in range bins, there being a range bin for all DC terms, a range bin for all first harmonic terms, a range bin for all second harmonic terms, etc. The phase rotation then takes place on this data on a range bin by range bin basis. Accordingly, the same number of samples now exists as were initially present, however the samples have been phase rotated by alteration of the stored phase.

An FFT is then applied to one or more of the groups of compensated samples on a frequency range basis (i.e., DC, 1st harmonic, 2nd harmonic, . . . ) whereby, assuming DC is the chosen group, the samples in all DC bins are subjected to another FFT. Generally, very few of the range bins will have data therein and generally the frequencies of interest are known, thereby allowing an educated choice of the frequency range or ranges to be made. The result is a plurality of bins which are denoted as Doppler bins wherein the columns are based upon Doppler frequency (i.e, DC, 1st harmonic, 2nd harmonic, etc.) and the rows correspond to the columns of range bins prior to this FFT.

If the object being tracked is moving, then for a given range bin, there will be a frequency shift from PRI to PRI. A display is then made of the doppler data, such as, for example, a range-Doppler map showing the amplitude of the complex number in each range bin to provide range and velocity measurements.

DESCRIPTION OF THE PREFERRED EMBODIMENT

Figure 2:
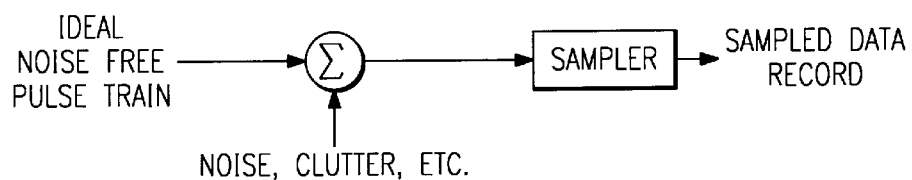
FIG. 2 is a block diagram of a procedure for sampling a pulse train.

In accordance with the present invention, a matched filter is implemented which accepts a sampled data record of the type as shown in FIG. 2 as an input, even though the receiver sampler was not synchronized to the transmitter waveform generator. A series of relatively short FFTs enables the phase correction process which produces the desired range/doppler response of the ideal matched filter. The basic concept is the principle of Fourier transform theory that a time shift in the time domain is modelled as a phase shift in the frequency domain. The problem in system applications where the receiver sampler is not synchronized with the transmitter waveform generator is one of a sampling error term which grows linearly across the CPI, assuming one can accurately model relative motion as constant velocity for the duration of one CPI. Since, in this case, there is a phase shift which grows linearly across the CPI, then it can be compensated in the Fourier transform (frequency) domain easily by introducing a phase shift which depends upon the amount of sampling phase error which had occurred at the time that pulse data was obtained.

Figure 1:
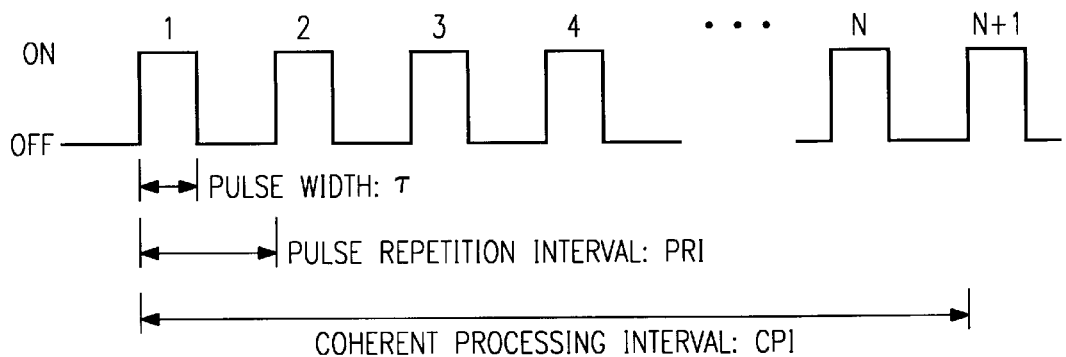
FIG. 1 is a diagram of a train of N pulses.
Figure 2A:
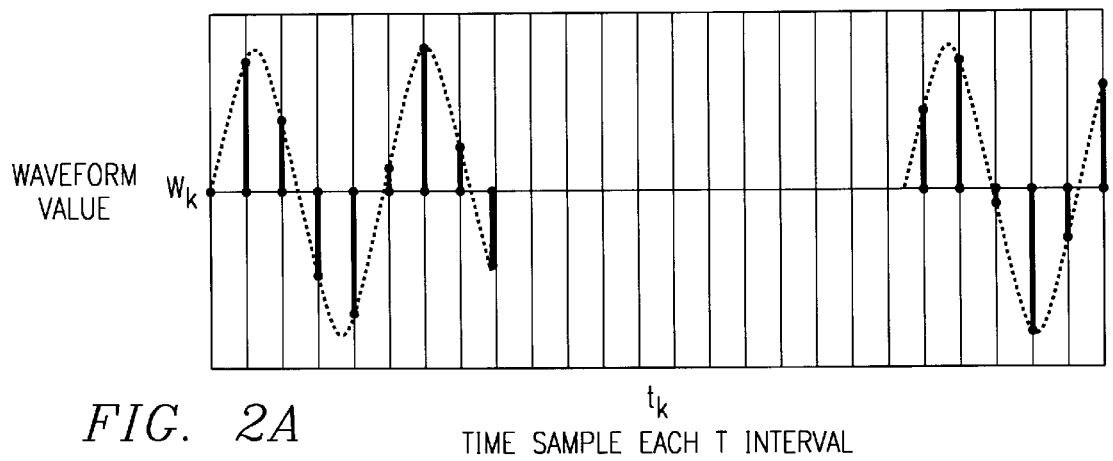
FIG. 2A is a diagram of a sampled pulse wave which has been sampled by the circuit of FIG. 2.

Referring again to FIG. 1, an FFT is performed on each individual pulse, i.e., N FFTs are performed, one FFT on each of the N pulses in the N PRIs of the CPI. The FFT time aperture is matched as closely as possible to the pulse width, τ. The number of samples within each pulse is $N_p = \tau/T$. In general, $N_p$ will not be a power of two, so $N_2 = 2^n$, the power of two that is equal to or just larger than $N_p$, is chosen where the power, n, is an integer. The data from the first pulse is subjected to an FFT by loading in the first $N_p$ points from the sampled data record of FIG. 2A. Next, zeros are loaded in the remaining slots according to the equation NBR ZEROS= $N_2 - N_p$, which will completely define the $N_2$ time samples required to perform the $N_2$ length FFT. If the waveform of FIG. 1 is real, then zeros are loaded as the imaginary part into the FFT process. If the pulse train samples were obtained by quadrature baseband conversion, then the in phase sample, I, is loaded as the real part and the quadrature phase sample, Q, is loaded as the imaginary part in preparation for the FFT step. In either case, sampling must take place at a sufficiently high rate to comply with the Nyquist criteria.

Data from the FFT of pulse 1, is combined with the FFT of subsequent pulses up through pulse N. However there is a problem of sampling phase error growth throughout the CPI for nonsynchronized systems as discussed hereinabove. The phase error problem arises because, in general, the ratio of PRI to sample interval T: X=PRI/T is not an integer. If it were an integer, then the phase of the samples within all of the N pulses would be identical.

Assuming by way of example that X=PRI/T=99.123 is the actual ratio. Then the fractional part of X, in this case 0.123, is a very important number if matched filter processing is to be realized from the asynchronous sampled data record. If the fractional part were zero, then the sampling within each of the N pulse waveforms would be identical (relative to the signal component) and the FFT frequency domain data would have the same phase values. This would permit simple combining of the frequency domain samples from transforms of pulse 1 through pulse N, since all the phases line up perfectly. However, if the fractional part is 0.123, then there is a known time shift of 0.123T seconds between any consecutive pulse pair set of samples. This leads to a predictable, undesired phase rotation of the transform domain data between pulse 1 and pulse 2, the same rotation between pulse 2 and pulse 3, out to the same rotation between pulse N−1 and pulse N.

Figure 3:
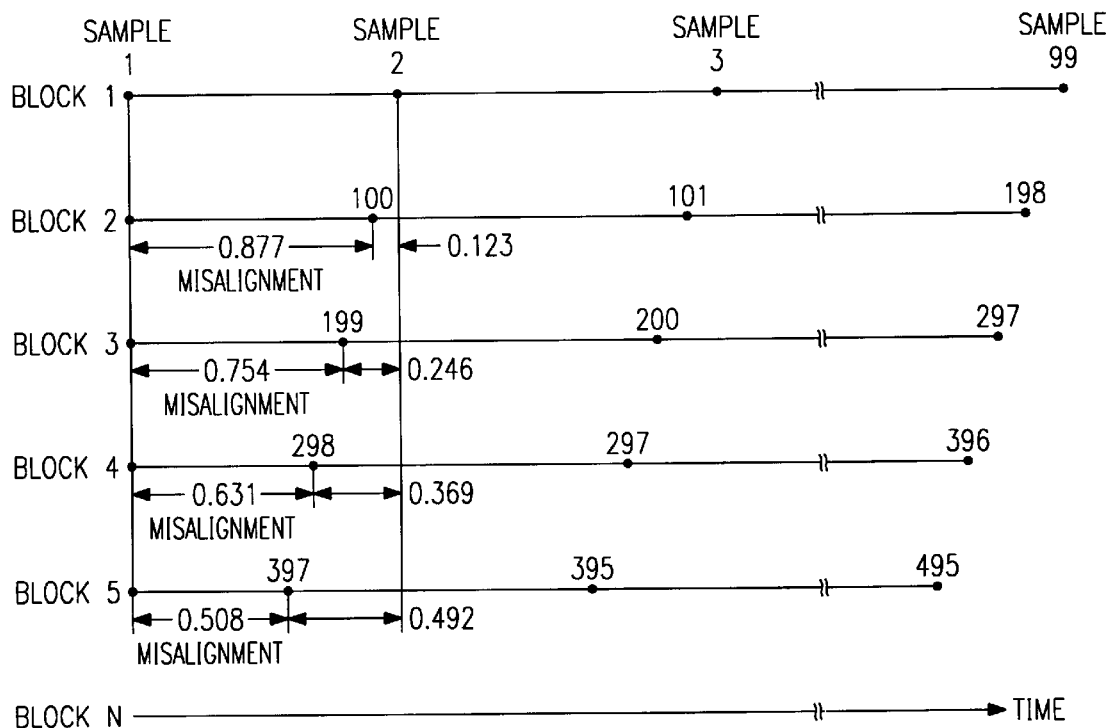
FIG. 3 is a diagram showing time skew within the CPI.

For the case where X=99.123, FIG. 3 shows how the block timing works out. The starting index for each block, which is the equivalent of a PRI as defined above, is shown in Table A:

TABLE A

STARTING INDEX DEPENDENCE ON RATIO OF PRI TO SAMPLE INTERVAL

| BLOCK | INDEX OF FIRST SAMPLE |
|---|---|
| 1 | 1 |
| 2 | 100 = 1 + Integer (99.123) |
| 3 | 199 = 1 + Integer (2 * 99.123) |
| 4 | 298 = 1 + Integer (3 * 99.123) |
| . | . |
| . | . |
| . | . |
| N | ( ) = 1 + Integer ((N − 1) * 99.123) |

The misalignment for each block is given in Table B:

TABLE B

MISALIGNMENT TIME VALUE $a_i$

| 1 | $a_1 = 0$ |
|---|---|
| 2 | $a_2 = 1 -$ fraction (99.123) = 0.877 |
| 3 | $a_3 = 1 -$ fraction (2 * 99.123) = 0.754 |
| 4 | $a_4 = 1 -$ fraction (3 * 99.123) = 0.631 |
| . | . |
| . | . |
| . | . |
| N | $a_N = 1 -$ fraction ((N − 1) * 99.123) |

This misalignment defines the angle that each complex number in the FFT frequency domain data must be rotated in preparation for coherent combining with all the other pulse transform data sets.

Assume $\{X_n\}$ is the FFT of the original (uncompensated) time domain pulse waveform. Then the compensation step consists of a complex multiplication:

$$Y_n = X_n * e^{j2\phi na/M}$$

where
n=1,2,3 . . . (M−1)
$\{Y_n\}$ is now the FFT of the phase compensated data
M is the FFT transform length
a is the misalignment time value from Table B that is appropriate for the particular pulse being compensated.
Making this phase correction allows the Fourier transform domain data from individual pulses to be combined coherently, since the sampling time skew of FIG. 3 has been corrected.

Figure 4:
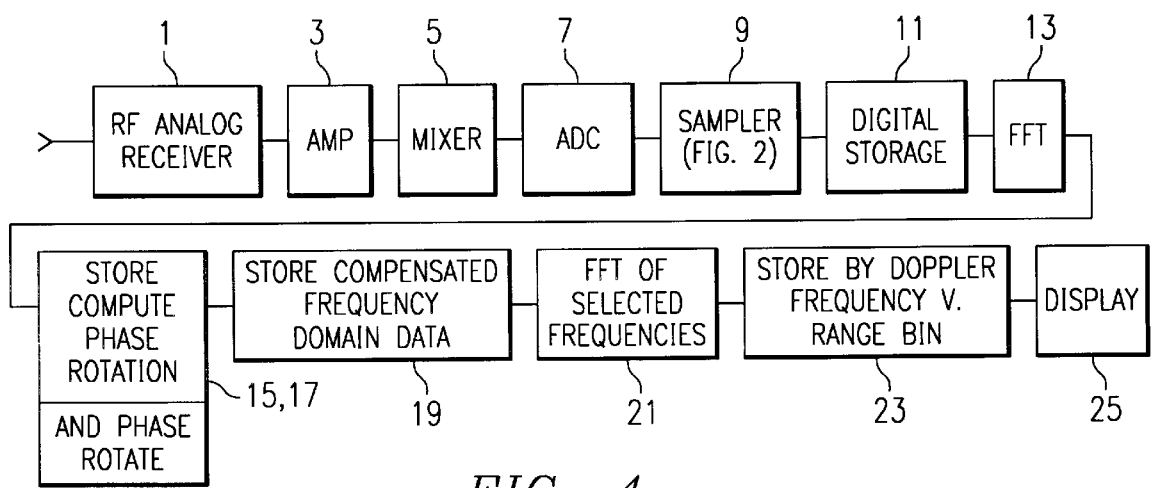
FIG. 4 is a diagram showing the processing steps in accordance with the present invention.
Figure 5:
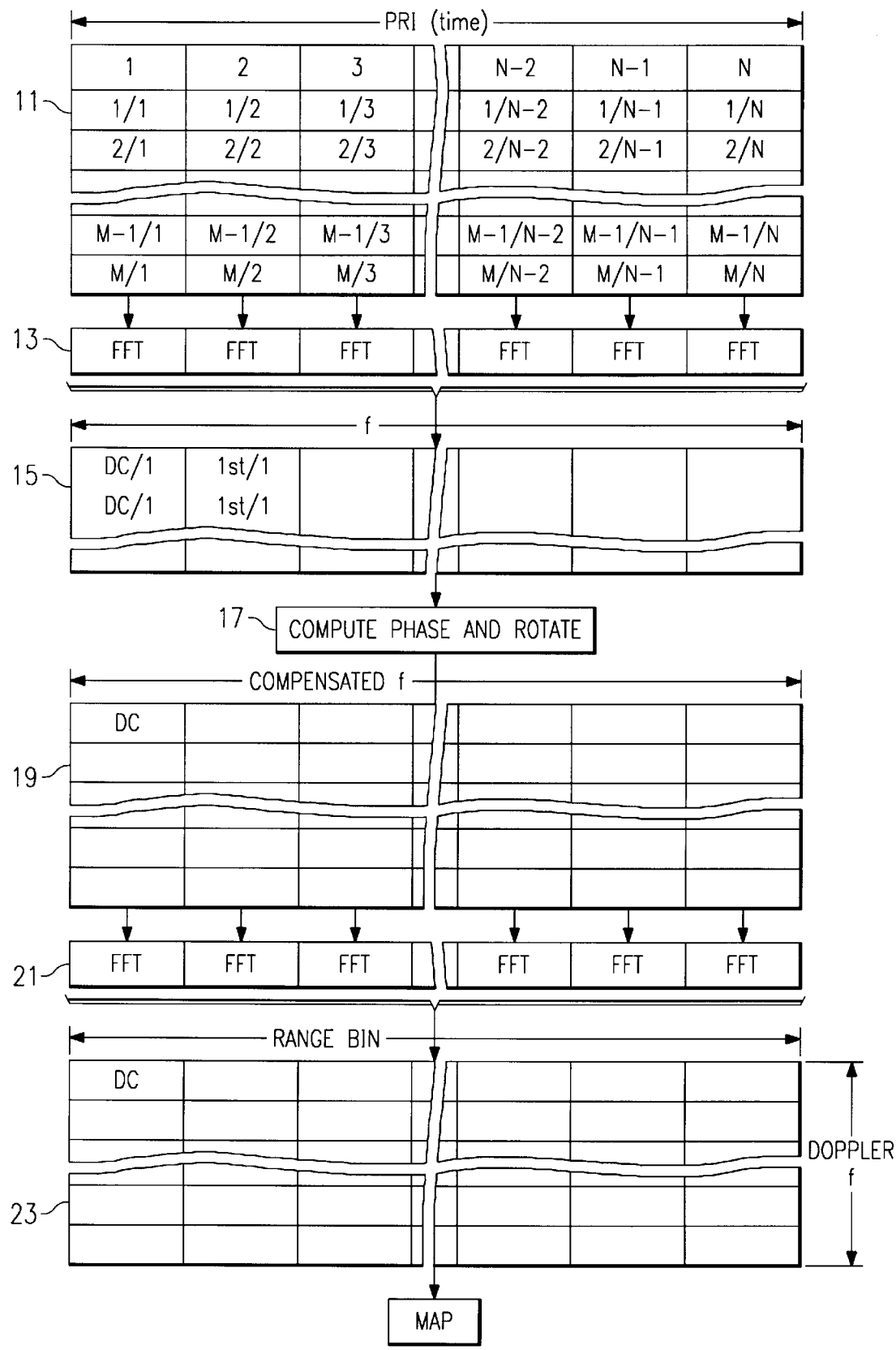
FIG. 5 is a diagram showing a portion of the process of FIG. 4 in greater detail.

As an example, application of the invention to radar systems is illustrated in the following sequence of steps, which are preferably performed in a computer or a hardware FFT engine with reference to FIG. 4. A data stream is received at an RF analog receiver 1 and amplified by an amplifier 3. The signal is then superheterodyne converted to baseband frequency which is near the DC region and within the bandwidth limitations of the circuit ADC via a mixer 5. The analog data stream is then converted to digital information by ADC 7. The data stream is then divided into data blocks (pulses) according to the known PRI, each block corresponding to one PRI by a sampler 9. Each PRI or data block is stored in digital storage 11 such that it is subdivided into sub-blocks (range bins) as better shown in FIG. 5. The length of the sub-block is approximately the pulse width. For each sub-block, pad zeros are added to the nearest radix 2 number that is greater than or equal to the sub-block length. In other words, the digital words from the ADC 7 are stored in a digital memory in range bins with each row corresponding to a succeeding PRI and each range bin in a row corresponding to a particular time interval in the PRI.

The digital words are retrieved from the digital storage 11 and fast Fourier transformed (FFT) 13, preferably with a hardware FFT chip, for transformation to the frequency domain as complex numbers with a phase and stored in range bins 15 based upon frequency (i.e., DC, 1st harmonic, 2nd harmonic, etc.), the stored data being a complex number having an amplitude and phase. In this step, a frequency domain (Blackman Harris) window is applied to the frequency sample of interest. Using the known pulse repetition interval (PRI), pulse width (τ) and ADC sample interval (T), the proper phase rotation is computed and applied to each complex number in the frequency domain data except the first data block which is the reference, providing compensated frequency domain data 17. The compensated frequency domain data is grouped by range bin, again according to frequency in storage 19.

More specifically, the data in each range bin of digital storage 11 (the system is designed to have some power of two ($n^2$) number of samples in each range bin, this being provided by adding the appropriate number of zeros, if necessary, to provide the proper number of samples) are then individually collectively subjected to the fast Fourier transform (FFT) 13 to provide the $n^2$ complex numbers which are now contiguous in frequency rather than in time. The result is that the first term out is the DC term, the second term is the first harmonic, the third term is the second harmonic, etc. These terms are then stored in range bins in memory 15, there being a range bin for all DC terms, a range bin for all first harmonic terms, a range bin for all second harmonic terms, etc. The phase rotation 17 then takes place on this data on a range bin by range bin basis. Accordingly, the same number of samples now exists as were initially present, however the samples have been phase rotated by alteration of the stored phase and stored in memory 19.

An FFT 21 is then applied to one or more of the groups of compensated samples on a frequency range basis (i.e., DC, 1st harmonic, 2nd harmonic, . . . ) whereby, assuming DC is the chosen group, the samples in all DC bins are subjected to another FFT. Generally, very few of the range bins will have data therein and generally the frequencies of interest are known, thereby allowing an educated choice of the frequency range or ranges to be made. The result is a plurality of bins in memory 23 which are denoted as Doppler bins wherein the columns are based upon Doppler frequency (i.e, DC, 1st harmonic, 2nd harmonic, etc.) and the rows correspond to the columns of range bins prior to this FFT.

Figure 6:
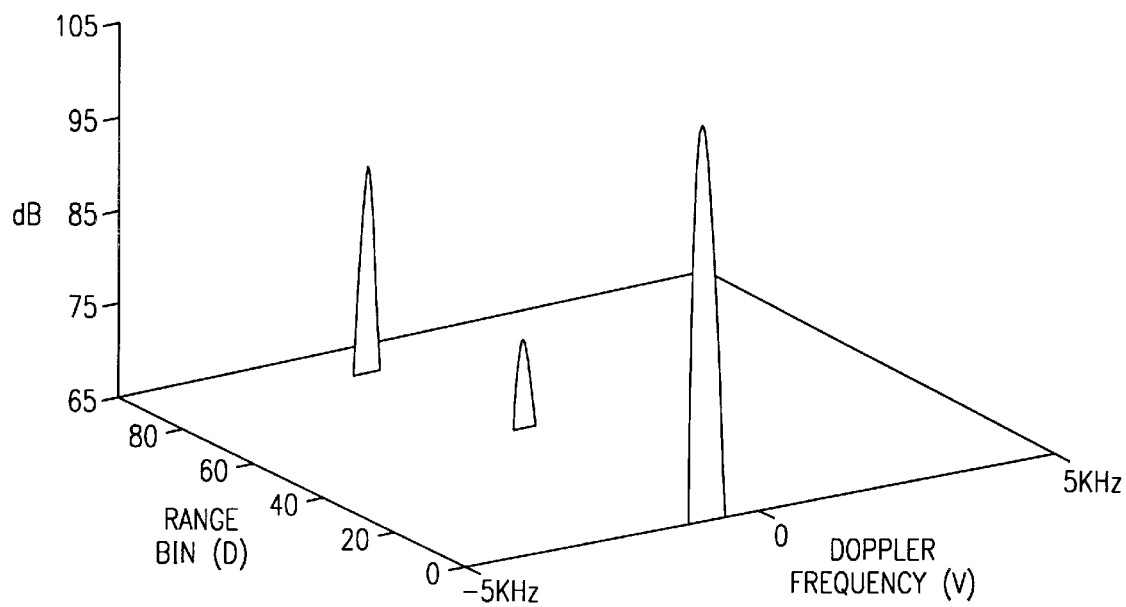
FIG. 6 is a range-doppler map obtained from use of the procedures in accordance with the present invention with phase compensation.
Figure 7:
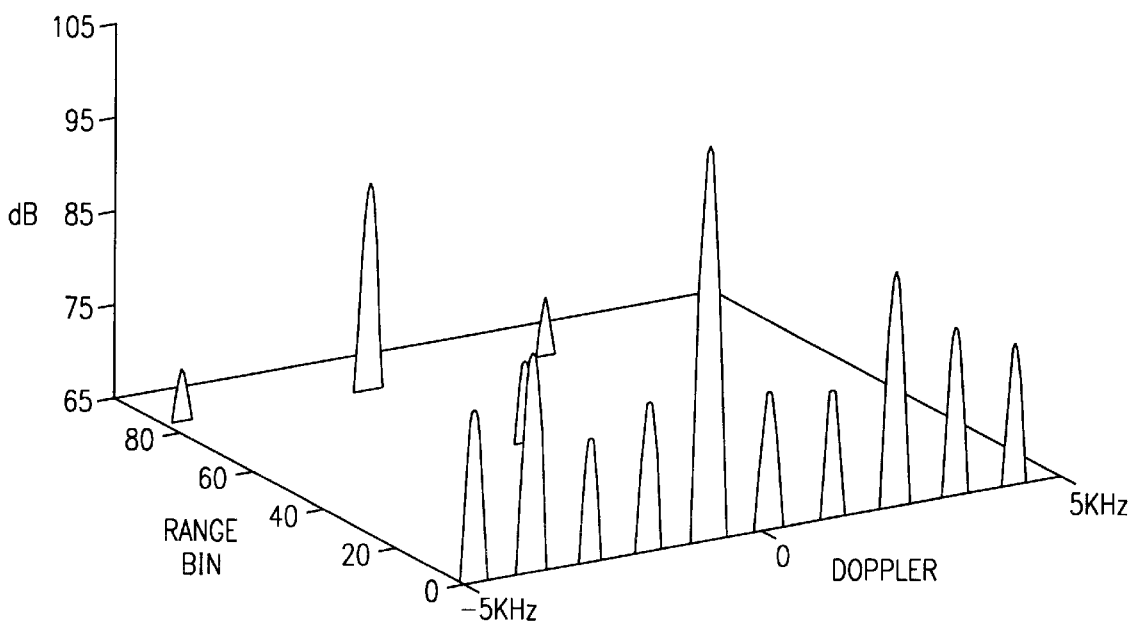
FIG. 7 is a range doppler map using the same data as in FIG. 4 but without phase compensation.

If the object being tracked is moving, then for a given range bin, there will be a frequency shift from PRI to PRI. A display 25 (FIG. 6), is then made of the doppler data, such as, for example, a range-Doppler map showing the amplitude of the complex number in each range bin to provide range and velocity measurements. FIG. 6 shows the resulting range/doppler map that results from a simulation of these steps for the case when there are three significant target echoes in the range/doppler space. FIG. 6 shows what the range/doppler map would look like if the same data was processed without performing the phase compensation step which is a central feature of the invention. Failure to perform the required phase compensation results in strong responses being splattered across the frequency dimension, thus losing the desired frequency resolution which the long CPI time interval provides. This undesired characteristic is why active, real-time synchronization of the receiver sampler with the transmitter clock has been required in the prior art.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

We claim:

1. A method of synchronization of pulse groups without a synchronization signal comprising the steps of:
   (a) selecting a plurality of equal time length coherent processing intervals from a stream of data in the time domain;
   (b) sampling the data in each of said coherent processing intervals during each of N equal pulse repetition intervals to provide samples of data, each sampling taking place for an equal portion of a said pulse repetition interval;
   (c) identifying each of said samples of data according to the position thereof in the associated coherent processing interval;
   (d) converting the time domain data to frequency domain data on the basis of said position, all of said samples with the same position in a different coherent processing interval being separately collectively converted;
   (e) compensating said frequency domain data for phase rotation; and
   (f) providing an FFT of selected ones of said frequency domain data.

2. The method of claim 1 wherein said stream of data in the time domain is analog data.

3. The method of claim 1 wherein said step of compensating comprises the steps of determining the length of said coherent processing interval, the length of said pulse repetition interval and the duration of said sampling and altering the phase of said frequency domain data in response thereto.

4. The method of claim 2 wherein said step of compensating comprises the steps of determining the length of said coherent processing interval, the length of said pulse repetition interval and the duration of said sampling and altering the phase of said frequency domain data in response thereto.

5. The method of claim 2 further including the step of providing an ADC, converting the bandwidth of said analog data to within the bandwidth of said ADC and converting the converted analog data to digital data with said ADC.

6. The method of claim 4 further including the step of providing an ADC, converting the bandwidth of said analog data to within the bandwidth of said ADC and converting the converted analog data to digital data with said ADC.

7. The method of claim 1 further including the step of displaying the results of the FFT of said selected ones of said frequency domain data.

8. The method of claim 2 further including the step of displaying the results of the FFT of said selected ones of said frequency domain data.

9. The method of claim 3 further including the step of displaying the results of the FFT of said selected ones of said frequency domain data.

10. The method of claim 4 further including the step of displaying the results of the FFT of said selected ones of said frequency domain data.

11. The method of claim 5 further including the step of displaying the results of the FFT of said selected ones of said frequency domain data.

12. The method of claim 6 further including the step of displaying the results of the FFT of said selected ones of said frequency domain data.

13. The method of claim 1 wherein said step of compensating comprises, assuming $\{X_n\}$ is the FFT of the original (uncompensated) time domain pulse waveform, the multiplication:

$$Y_n = X_n * e^{j2\phi na/M}$$

where:
n=1,2,3 ... (M−1);
$\{Y_n\}$ is now the FFT of the phase compensated data;
M is the FFT transform length; and
a is the misalignment time value from Table B that is appropriate for the particular pulse being compensated.

14. The method of claim 3 wherein said step of compensating comprises, assuming $\{X_n\}$ is the FFT of the original (uncompensated) time domain pulse waveform, the multiplication:

$$Y_n = X_n * e^{j2\phi na/M}$$

where:
n=1,2,3 ... (M−1);
$\{Y_n\}$ is now the FFT of the phase compensated data;
M is the FFT transform length; and
a is the misalignment time value from Table B that is appropriate for the particular pulse being compensated.

15. The method of claim 7 wherein said step of compensating comprises, assuming $\{X_n\}$ is the FFT of the original (uncompensated) time domain pulse waveform, the multiplication:

$$Y_n = X_n * e^{j2\phi na/M}$$

where:
n=1,2,3 ... (M−1);
$\{Y_n\}$ is now the FFT of the phase compensated data;
M is the FFT transform length; and
a is the misalignment time value from Table B that is appropriate for the particular pulse being compensated.

16. The method of claim 9 wherein said step of compensating comprises, assuming $\{X_n\}$ is the FFT of the original (uncompensated) time domain pulse waveform, the multiplication:

$$Y_n = X_n * e^{j2\phi na/M}$$

where:

n=1,2,3 ... (M−1);

$\{Y_n\}$ is now the FFT of the phase compensated data;

M is the FFT transform length; and a is the misalignment time value from Table B that is appropriate for the particular pulse being compensated.

17. A system for synchronization of pulse groups without a synchronization signal comprising:

(a) selecting means for selecting a plurality of equal time length coherent processing intervals from a stream of data in the time domain;

(b) sampling means for sampling the data in each of said coherent processing intervals during each of N equal pulse repetition intervals to provide samples of data, each sampling taking place for an equal portion of a said pulse repetition interval;

(c) identifying means for identifying each of said samples of data according to the position thereof in the associated coherent processing interval;

(d) a converter for converting the time domain data to frequency domain data on the basis of said position, all of said samples with the same position in a different coherent processing interval being separately collectively converted;

(e) compensating means for compensating said frequency domain data for phase rotation; and (f) FFT means for providing an FFT of selected ones of said frequency domain data.

18. The system of claim 17 wherein said stream of data in the time domain is analog data.

19. The system of claim 17 wherein said compensating means comprises means to determine the length of said coherent processing interval, the length of said pulse repetition interval and the duration of said sampling and altering the phase of said frequency domain data in response thereto.

20. The system of claim 18 wherein said compensating means comprises means to determine the length of said coherent processing interval, the length of said pulse repetition interval and the duration of said sampling and altering the phase of said frequency domain data in response thereto.

21. The system of claim 18 further including an ADC, means to convert the bandwidth of said analog data to within the bandwidth of said ADC, said ADC converting the converted analog data to digital data.

22. The system of claim 20 further including an ADC, means to convert the bandwidth of said analog data to within the bandwidth of said ADC, said ADC converting the converted analog data to digital data.

23. A system for synchronization of pulse groups without a synchronization signal comprising:

(a) selecting circuitry for selecting a plurality of equal time length coherent processing intervals from a stream of data in the time domain;

(b) sampling circuitry for sampling the data in each of said coherent processing intervals during each of N equal pulse repetition intervals to provide samples of data, each sampling taking place for an equal portion of a said pulse repetition interval;

(c) identifying circuitry for identifying each of said samples of data according to the position thereof in the associated coherent processing interval;

(d) a converter for converting the time domain data to frequency domain data on the basis of said position, all of said samples with the same position in a different coherent processing interval being separately collectively converted;

(e) compensating circuitry for compensating said frequency domain data for phase rotation; and (f) FFT circuitry for providing an FFT of selected ones of said frequency domain data.

24. The system of claim 23 wherein said stream of data in the time domain is analog data.

25. The system of claim 23 wherein said compensating circuitry comprises circuitry to determine the length of said coherent processing interval, the length of said pulse repetition interval and the duration of said sampling and altering the phase of said frequency domain data in response thereto.

26. The system of claim 24 wherein said compensating circuitry comprises circuitry to determine the length of said coherent processing interval, the length of said pulse repetition interval and the duration of said sampling and altering the phase of said frequency domain data in response thereto.

27. The system of claim 24 further including an ADC, circuitry to convert the bandwidth of said analog data to within the bandwidth of said ADC, said ADC converting the converted analog data to digital data.

28. The system of claim 26 further including an ADC, circuitry to convert the bandwidth of said analog data to within the bandwidth of said ADC, said ADC converting the converted analog data to digital data.

* * * * *